United States Patent
Cantemir

(10) Patent No.: US 11,239,790 B1
(45) Date of Patent: Feb. 1, 2022

(54) SOLAR TOWER SYSTEM

(71) Applicant: Mihai Cantemir, West Palm Beach, FL (US)

(72) Inventor: Mihai Cantemir, West Palm Beach, FL (US)

(*) Notice: Subject to any disclaimer, the term of this patent is extended or adjusted under 35 U.S.C. 154(b) by 0 days.

(21) Appl. No.: 16/945,846

(22) Filed: Aug. 1, 2020

(51) Int. Cl.
| H02S 30/10 | (2014.01) |
| H02S 40/20 | (2014.01) |
| H02S 10/20 | (2014.01) |
| H01L 31/054 | (2014.01) |

(52) U.S. Cl.
CPC .......... *H02S 30/10* (2014.12); *H01L 31/0543* (2014.12); *H02S 10/20* (2014.12); *H02S 40/20* (2014.12)

(58) Field of Classification Search
CPC . H01L 31/0543; H01L 31/055; H01L 27/304; H02S 10/30; F24S 23/00; F24S 23/10; F24S 23/11; F24S 23/12; H01G 9/2086
See application file for complete search history.

(56) References Cited

U.S. PATENT DOCUMENTS

| 3,976,508 A | 8/1976 | Mlavsky | |
| 4,116,718 A * | 9/1978 | Yerkes | H01L 31/0547 136/246 |
| 4,882,239 A | 11/1989 | Grimmer et al. | |
| 5,560,783 A * | 10/1996 | Hamlen | H02S 10/30 136/253 |
| 6,150,995 A | 11/2000 | Gilger | |
| 8,742,252 B2 | 6/2014 | Buller | |
| 8,823,315 B2 | 9/2014 | Oppizzi | |
| 2008/0047599 A1 | 2/2008 | Buller et al. | |
| 2009/0040750 A1 * | 2/2009 | Myer | F21S 9/037 362/183 |
| 2010/0229939 A1 * | 9/2010 | Shen | H01L 31/022425 136/256 |
| 2015/0155414 A1 * | 6/2015 | Bedell | F24S 30/452 320/101 |
| 2017/0187322 A1 * | 6/2017 | Pisharodi | H01L 31/05 |
| 2020/0006586 A1 * | 1/2020 | Bae | H01L 31/0543 |

FOREIGN PATENT DOCUMENTS

JP        03022573 A  *  1/1991

OTHER PUBLICATIONS

Machine translation of JP03-022573A (Year: 1991).*

* cited by examiner

*Primary Examiner* — Eric R Smith
(74) *Attorney, Agent, or Firm* — Runyan Law; Charles Runyan

(57) ABSTRACT

A solar tower system; the solar tower system includes a module unit having a cylindrical core, a series of tower slices positioned in a continuous series around the cylindrical core and together forming a cylindrical solar tower, and a battery unit attachment. Each tower slice comprises a clear plastic block having a series of solar panel bays, each configured to house one of a series of solar panels. The solar tower system provides a portable solar energy source for various uses.

18 Claims, 5 Drawing Sheets

SOLAR TOWER SYSTEM

BACKGROUND OF THE INVENTION

This section includes background information that may be useful in understanding this disclosure. Including this information is not an admission that any of it is prior art nor material to the disclosed inventions. Likewise, explicitly or implicitly referencing any publication or document is not an admission that the publication or document is prior art.

TECHNICAL FIELD

The present invention generally relates to the field of power sources of existing art and, more specifically, relates to solar power devices.

RELATED ART

Power generation is a leading cause of air pollution and a significant source of U.S. global warming emissions. Therefore, many people and companies have switched to solar energy, but solar panels cannot be mounted and efficient in all areas, limiting access. Additionally, the cost of materials and general upkeep may not make them a convenient solution for everyone. A suitable solution is desired.

U.S. Pat. No. 8,742,252 to Benyamin Buller, et. al. relates to elongated photovoltaic cells in casings with a filling layer. The described elongated photovoltaic cells in casings with a filling layer includes a solar cell unit comprising a cylindrical shaped solar cell and a transparent tubular casing. The tubular shaped solar cell comprises a back-electrode, a semiconductor junction circumferentially disposed on the back-electrode and a transparent conductive layer disposed on the semiconductor junction. The transparent tubular casing is circumferentially sealed onto the transparent conductive layer of the cylindrical shaped solar cell. A solar cell unit comprising a cylindrical shaped solar cell, a filler layer, and a transparent tubular casing is provided. The cylindrical shaped solar cell comprises a cylindrical substrate, a back-electrode circumferentially disposed on the cylindrical substrate, a semiconductor junction circumferentially disposed on the back-electrode, and a transparent conductive layer disposed on the semiconductor junction. The filler layer is circumferentially disposed on the transparent conductive layer and the transparent tubular casing is circumferentially disposed onto the filler layer.

SUMMARY OF THE INVENTION

Because of the disadvantages inherent in the known power source art, the present disclosure provides a novel solar tower system. The general purpose of the present disclosure is to provide a simple and convenient power source that can be mounted in remote locations or other places that are difficult to install traditional solar panels.

A solar tower system is disclosed herein. The solar tower system includes a solar tower assembly comprising a module unit having a cylindrical core, a series of tower slices positioned in a continuous series around the cylindrical core and together forming a cylindrical solar tower, and a battery unit attachment. Each tower slice comprises a clear plastic block and a series of solar panels. The clear plastic block allows for light transfer through the tower slices. The clear plastic block of the tower slices comprises a series of solar panel bays, each configured to house one of the series of solar panels. The series of solar panels are positioned equidistantly in a series. The series of solar panels comprises a front-side and a rear-side, the front-side faces outward from the clear plastic block. The battery unit attachment is in electrical communication with the module unit. The solar tower system is a type of solar panel that can be semi-permanently mounted in locations where it would otherwise be challenging to mount traditional planar solar panels.

This document describes certain aspects, advantages, and novel features of the device. A particular version of the device does not necessarily achieve all such advantages. Thus, the device may be designed or practiced in a manner that achieves or optimizes one advantage or group of advantages without necessarily achieving other advantages. The claims point out the novel device features.

BRIEF DESCRIPTION OF THE DRAWINGS

The figures that accompany the written portion of this specification illustrate embodiments and methods of use for the present disclosure, a solar tower system, constructed and operative according to the teachings of the present disclosure.

DETAILED DESCRIPTION

As discussed above, embodiments of the present disclosure relate to power sources and, more particularly, to a solar tower system as used to improve the efficient use of solar energy as a power source.

Generally, a solar tower system provides a simple and convenient power source that can be mounted in remote locations or other places that are difficult to install traditional solar panels. The device requires little maintenance and upkeep, especially in the winter months. It ensures access to electricity in case primary power sources fail or regions that typically don't have access. The device reduces reliance on pollution-causing energy sources. The present invention uses inexpensive materials to produce, helping companies lower costs.

The solar tower system is a type of solar panel that can be semi-permanently mounted in locations where it would otherwise be challenging to mount traditional planar solar panels. This innovative product features a modular, low maintenance solar tower, made from recycled plastic or other suitable material. The solar cell unit can be cylindrical with a circular opening in the middle to accommodate a pole but may also be offered in different shapes and sizes as needed to fit in tight spaces. Additionally, the tower measures approximately 5' to 6' in height. Further, multiple towers can be combined, creating a significant power source for charging an electric vehicle, homes, buildings, and more. The exact specifications may vary upon manufacturing.

FIGS. 1-5 shows various views of a solar tower system 100.

Figure 1:
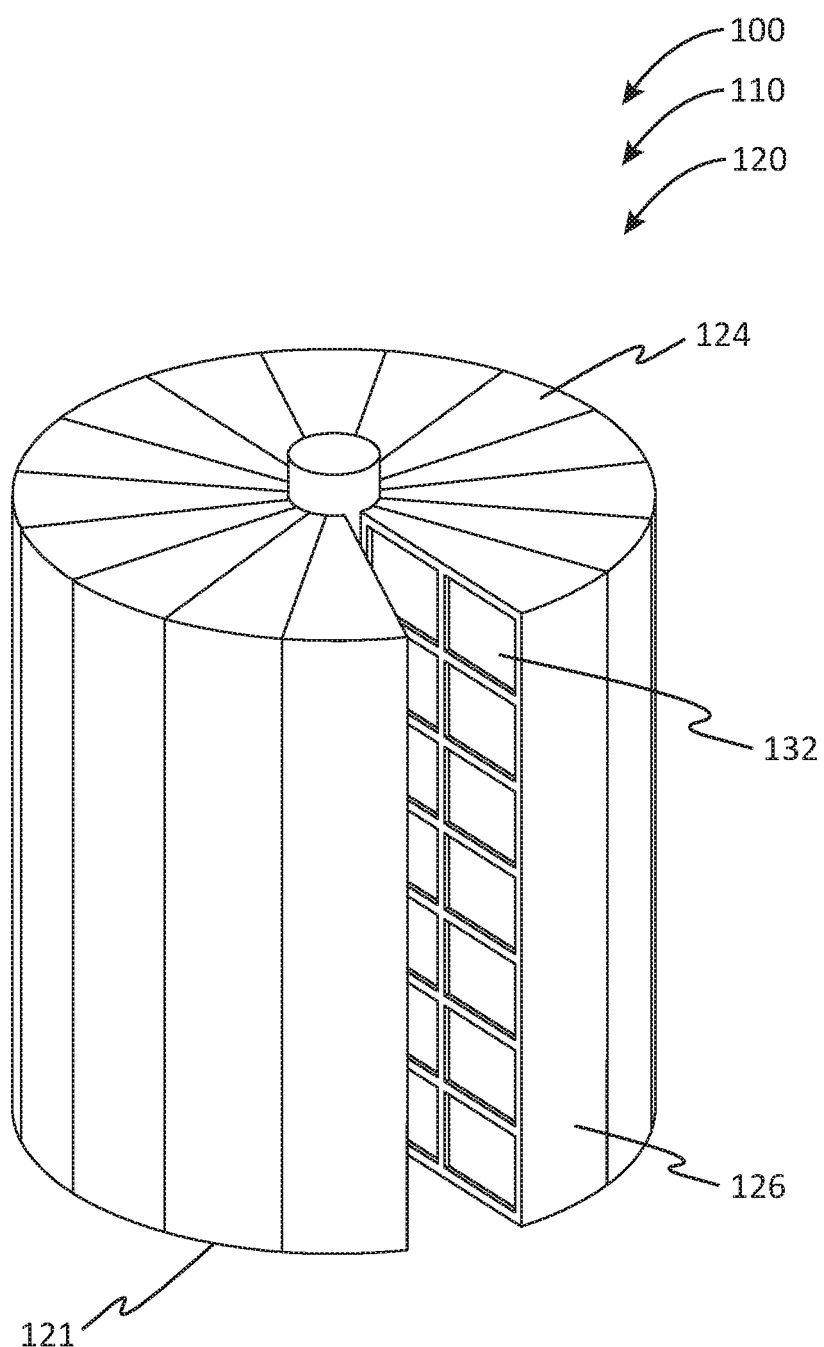
FIG. 1 is a cut-away view of the solar tower system during an 'in-use' condition, according to an embodiment of the disclosure.

FIG. 1 shows a solar tower system 100 may be beneficially used to provide a portable alternative energy power source. As illustrated, the solar tower system 100 may include a solar tower assembly 110 comprising a module unit 120 having a cylindrical core 122, a series of tower slices 126 positioned in a continuous series around the cylindrical core 122 and together forming a cylindrical solar tower 124, and a battery unit attachment 130. Each tower slice 126 comprises a clear plastic block 128 and a series of solar panels 132. The present invention provides a simple and convenient power source that can be mounted in remote locations or other places that are difficult to install traditional solar panels 132.

Figure 2:
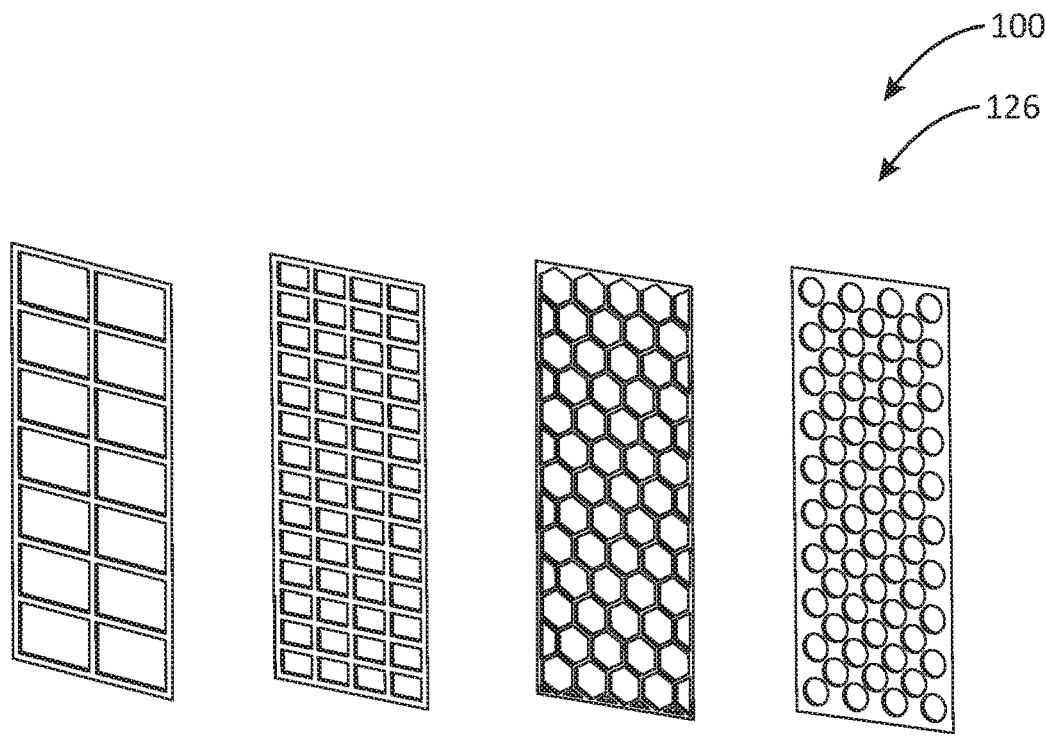
FIG. 2 is an exploded view of a solar tower system.
Figure 2:
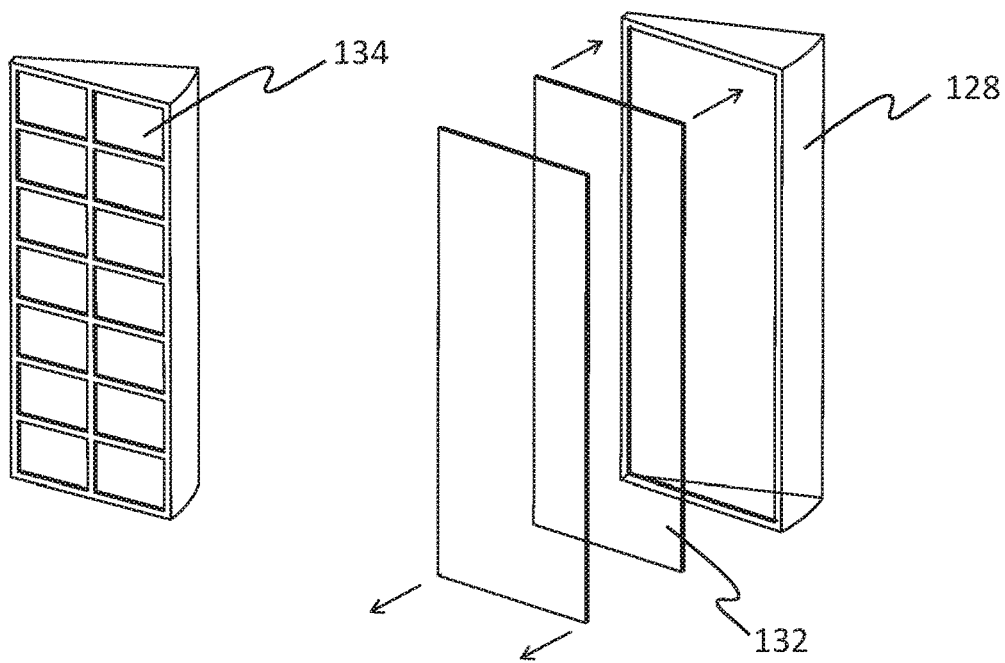

FIG. 2 shows the solar tower system 100 of FIG. 1, a solar tower system. As above, the solar tower system 100 may include the solar tower assembly 110 comprising the module unit 120 having the cylindrical core 122, the series of tower slices 126 positioned in a continuous series around the cylindrical core 122, and the battery unit attachment 130. The clear plastic block 128 of the tower slices 126 comprises a series of solar panel bays 134, each configured to house one of the series of solar panels 132. The series of solar panels 132 are positioned equidistantly in a series. The series of solar panels 132 may be rectangle, square, hexagonal, or circular shaped. The series of solar panels 132 are arranged in a pattern along the clear plastic block 128. The series of solar panels 132 comprise a front-side and a rear-side, the front-side faces outward from the clear plastic block 128. The clear plastic block 128 allows for light transfer through the tower slices 126.

Figure 3:
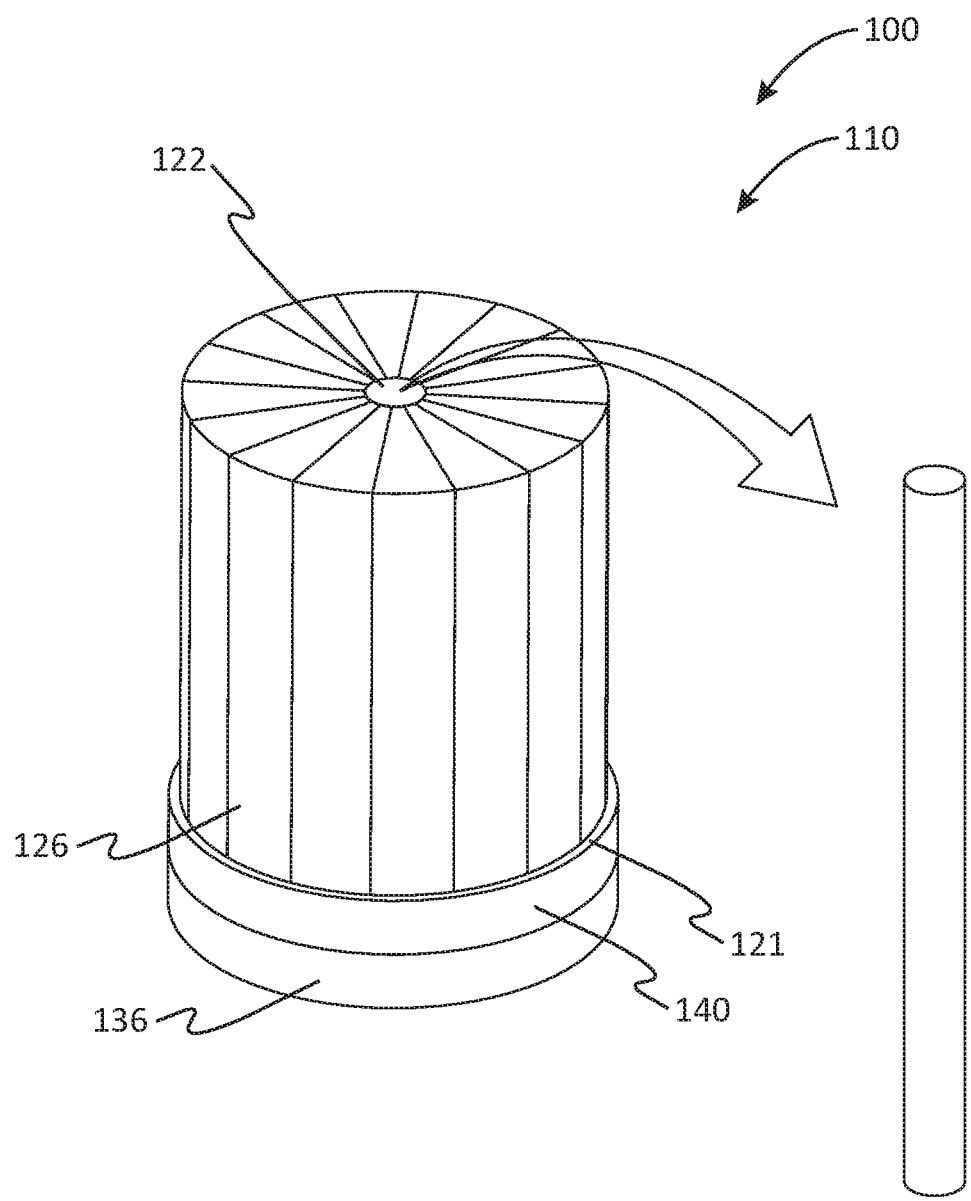
FIG. 3 is a perspective view of a solar tower system.

FIG. 3 is a perspective view of the solar tower system 100 of FIG. 1, a solar tower system. The battery unit attachment 130 is in electrical communication with the module unit 120. The battery unit attachment 130 is attached to a base portion 121 of the module unit 120. The battery unit attachment 130 comprises at least one battery bay storage compartment 136. In a preferred embodiment, the battery unit attachment 130 comprises two of the battery bay storage compartments 136. The battery unit attachment 130 comprises a central circular aperture. In certain embodiments, the system further comprises a refrigeration unit attachment 140 to be used with a water supply unit.

Figure 4:
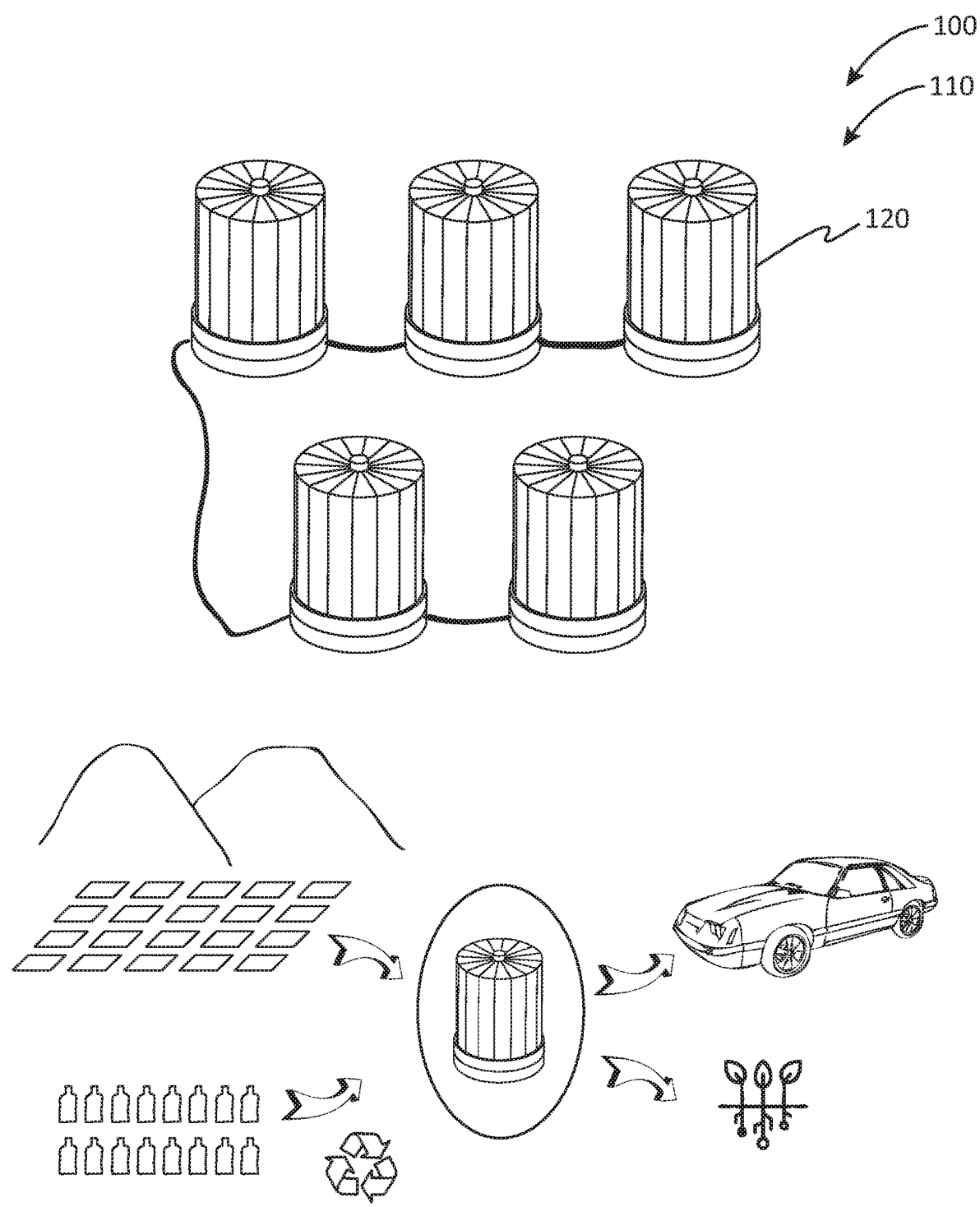
FIG. 4 is a perspective view of a solar tower system.

FIG. 4 is a perspective view of the solar tower system 100 of FIG. 1, a solar tower system. The cylindrical core 122 also comprises a clear material. The cylindrical core 122 includes a rod-like profile and may be filled with liquid for optimal light travel. The cylindrical core 122 is configured to receive a cylindrical object and support the solar tower system thereon. A plurality of connected module units 120 may be combined, creating a significant power source for charging an electric vehicle, homes, buildings, and more.

Figure 5:
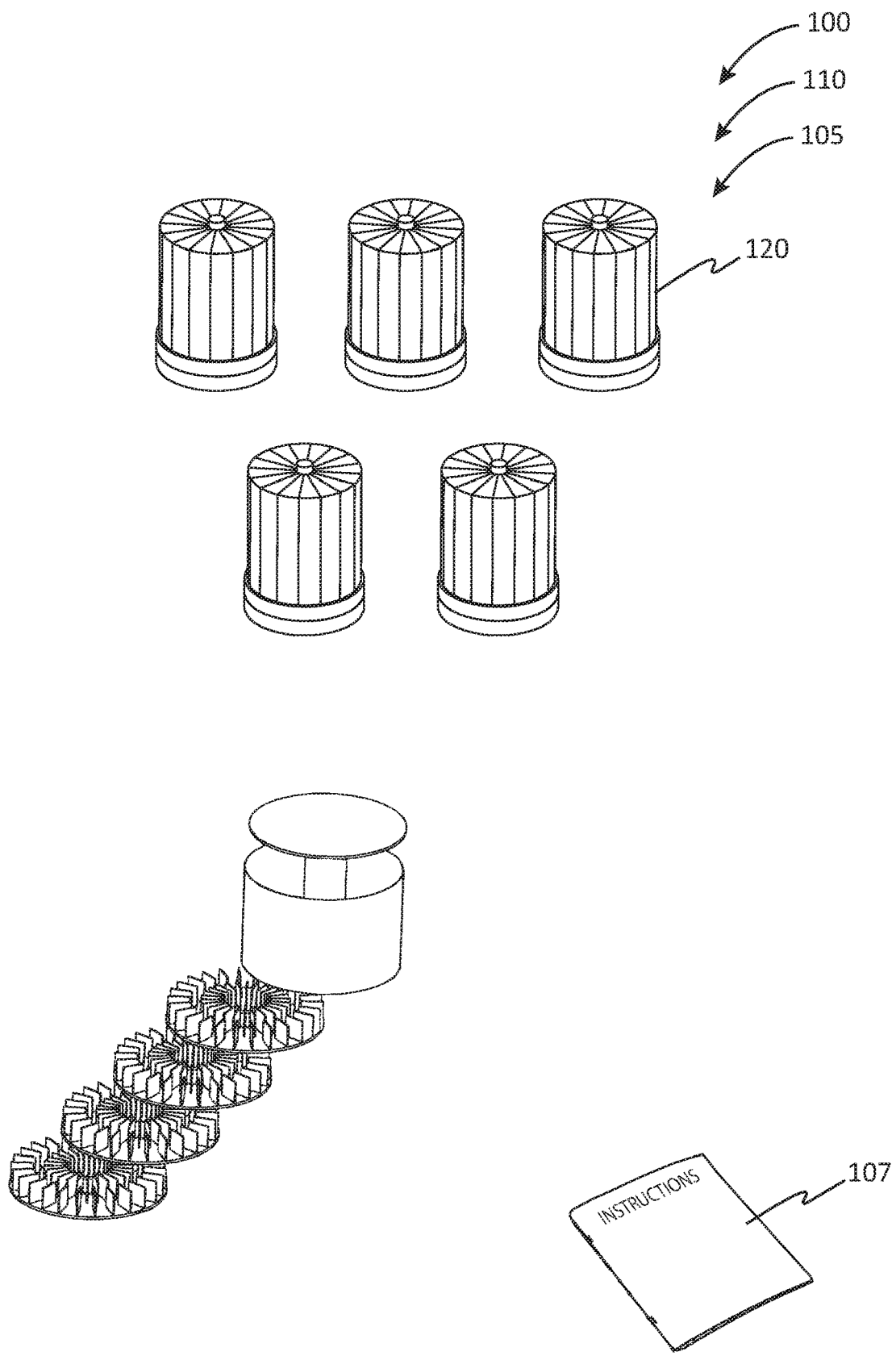
FIG. 5 is a perspective view of solar tower system.

FIG. 5 shows other views of the solar tower system 100.

What is claimed is:

1. A solar tower system, the solar tower system comprising:
  a solar tower assembly comprising
    a module unit having
      a cylindrical core;
      and
      a series of tower slices positioned in a continuous series around the cylindrical core, forming a cylindrical solar tower;
      wherein each tower slice comprises a clear plastic block and a series of solar panels, each solar panel of the series of solar panels being planar in shape and contained within the clear plastic block, each plastic block being formed in a wedge, such that when the series of tower slices are radially arrayed about the cylindrical core the series of tower slices may fully circumscribe the cylindrical core, each solar panel of the series of solar panels being oriented in the plastic block such that the solar panel is aligned radially about the cylindrical core when the series of tower slices is radially arrayed about the cylindrical core;
    and
  a battery unit attachment.

2. The solar tower system of claim 1, wherein the cylindrical core receives a cylindrical object, and the cylindrical object supports the solar tower system.

3. The solar tower system of claim 1, wherein each solar panel of each series of solar panels is rectangular, square, hexagonal, or circular.

4. The solar tower system of claim 3, wherein the solar panels of a respective series of solar panels sit in a pattern along the clear plastic block of the respective tower slice.

5. The solar tower system of claim 1, wherein the clear plastic blocks comprise a series of solar panel bays, each configured to house one of the solar panels.

6. The solar tower system of claim 5, wherein each series of solar panels comprises a front-side and a rear-side, the front-side faces outwards from the clear plastic block.

7. The solar tower system of claim 1, wherein the battery unit attachment attaches to a base portion of the module unit.

8. The solar tower system of claim 7, wherein the battery unit attachment comprises at least one battery bay storage compartment.

9. The solar tower system of claim 8, wherein the battery unit attachment comprises exactly two battery bay storage compartments.

10. The solar tower system of claim 7, wherein the battery unit attachment comprises a central circular aperture.

11. The solar tower system of claim 1, wherein the battery unit electrically connects to the module unit.

12. The solar tower system of claim 1, wherein each clear plastic block permits light transfer through the tower slices.

13. The solar tower system of claim 1, wherein the system further comprises a refrigeration unit attachment to be used with a water supply unit.

14. The solar tower system of claim 1, wherein the cylindrical core comprises a clear material.

15. The solar tower system of claim 14, wherein the cylindrical core is filled with liquid.

16. The solar tower system of claim 15, wherein the cylindrical core includes a rod.

17. The solar tower system of claim 1, wherein the solar tower assembly includes a plurality of connected module units used to power an external device.

18. A solar tower system, the solar tower system comprising:
  a solar tower assembly comprising
    a module unit having
      a cylindrical core;
      a series of tower slices positioned in a continuous series around the cylindrical core, forming a cylindrical solar tower;
      and
      wherein each tower slice comprises a clear plastic block and a series of solar panels, each solar panel of the series of solar panels being planar in shape and contained within the clear plastic block, each plastic block being formed in a wedge, such that when the series of tower slices are radially arrayed about the cylindrical core the series of tower slices may fully circumscribe the cylindrical core, each solar panel of the series of solar panels being oriented in the plastic block such that the solar panel is aligned radially about the cylindrical core when the series of tower slices is radially arrayed about the cylindrical core;

a battery unit attachment;

wherein the cylindrical core received a cylindrical object, and the cylindrical object supports the solar tower system;

wherein each series of solar panels sits in a pattern along the clear plastic block of the respective tower slices;

wherein each clear plastic block of the tower slices comprises a series of solar panel bays, each configured to house one of the solar panels;

wherein each series of solar panels comprises a front-side and a rear-side, the front-side faces outward from the clear plastic block;

wherein the battery unit attachment attached to a base portion of the module unit;

wherein the battery unit attachment comprises at least one battery bay storage compartment;

wherein the battery unit attachment comprises a center circular aperture;

wherein the battery unit attachment electrically connects to the module unit;

wherein each clear plastic block permits light transfer through the tower slices;

wherein the cylindrical core comprises a clear material; and wherein the cylindrical core is filled with liquid.

* * * * *